(12) United States Patent
Fang et al.

(10) Patent No.: US 9,429,802 B2
(45) Date of Patent: Aug. 30, 2016

(54) DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yezhou Fang, Beijing (CN); Jian Ren, Beijing (CN); Zhenwei Wang, Beijing (CN); Jinbo Ding, Beijing (CN); Jian Li, Beijing (CN); Bin Li, Beijing (CN); Xin Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 56 days.

(21) Appl. No.: 14/498,470

(22) Filed: Sep. 26, 2014

(65) Prior Publication Data

US 2015/0333020 A1 Nov. 19, 2015

(30) Foreign Application Priority Data

May 14, 2014 (CN) .................... 2014 2 0247851 U

(51) Int. Cl.
| | |
|---|---|
| H01L 29/12 | (2006.01) |
| G02F 1/1362 | (2006.01) |
| H01L 23/60 | (2006.01) |
| H01L 23/522 | (2006.01) |
| H01L 23/528 | (2006.01) |
| H01L 27/12 | (2006.01) |
| G02F 1/1345 | (2006.01) |

(52) U.S. Cl.
CPC ..... *G02F 1/136204* (2013.01); *G02F 1/13454* (2013.01); *H01L 23/5223* (2013.01); *H01L 23/5286* (2013.01); *H01L 23/60* (2013.01); *H01L 27/124* (2013.01)

(58) Field of Classification Search
CPC ..................... H01L 27/0248; H01L 27/0288
USPC ............................................................. 257/71
See application file for complete search history.

(56) References Cited

U.S. PATENT DOCUMENTS

| | | | | |
|---|---|---|---|---|
| 6,104,449 A * | 8/2000 | Takahashi | ......... | G02F 1/136204 349/40 |
| 6,384,878 B1 * | 5/2002 | Kwak | ............... | G02F 1/136204 349/192 |
| 6,538,708 B2 * | 3/2003 | Zhang | ............... | G02F 1/136204 349/40 |
| 6,573,969 B1 * | 6/2003 | Watanabe | ........... | G02F 1/13394 257/347 |
| 7,057,677 B2 * | 6/2006 | Zhang | ................. | G02F 1/13454 257/E27.111 |
| 7,342,617 B2 * | 3/2008 | Tanaka | ............... | G02F 1/136204 349/147 |
| 7,375,788 B2 * | 5/2008 | Chiang | ............... | G02F 1/13394 349/155 |
| 2009/0261444 A1 * | 10/2009 | Yamazaki | ........... | H01L 23/5223 257/459 |
| 2015/0002779 A1 * | 1/2015 | Joten | ................. | G02F 1/133308 349/59 |

* cited by examiner

*Primary Examiner* — Reema Patel
*Assistant Examiner* — Syed Gheyas
(74) *Attorney, Agent, or Firm* — Ladas & Parry LLP

(57) ABSTRACT

A display panel and a display device are provided, and the display panel comprises a GOA circuit; a first conducting wire and a second conducting wire are disposed in a region outside the GOA circuit; an insulating layer is disposed between the first conducting wire and the second conducting wire; and the first conducting wire, the insulating layer and the second conducting wire form a first capacitor. The display panel can protect the internal signal lines of the GOA circuit and the display panel, and increase the antistatic ability of the display panel and the yield of products.

12 Claims, 4 Drawing Sheets

DISPLAY PANEL AND DISPLAY DEVICE

TECHNICAL FIELD

At least one embodiment of the present disclosure relates to a display panel and a display device.

BACKGROUND

In the display field, in order to decrease costs and realize a narrow-bezel design, a GOA (Gate Driver on Array) technology is generally used. The GOA technology does not require any gate driver integrated circuit chip bonded outside a display panel, but provides the gate driver integrated circuit on an array substrate of the display panel.

In a GOA technology, GOA circuits are disposed on two sides of the display area 01 of a display panel, and the GOA circuits comprise GOA signal lines 02, as illustrated in FIG. 1. These GOA signal lines lead to dense wire arrangement in the periphery of the GOA circuits. For example, a schematic view of a GOA region is illustrated in FIG. 2. The GOA circuits comprise GOA units 21 and GOA signal lines 22, and the GOA signal lines 22 are connected to the GOA units 21 through conducting wires.

SUMMARY

At least one embodiment of the present disclosure provides a display panel and a display device, so as to protect a GOA circuit effectively, prevent the interior of the GOA circuit from being damaged by an external static electricity, and improve the yield of products.

At least one embodiment of the present disclosure provides a display panel, which comprises a GOA circuit; a first conducting wire and a second conducting wire are disposed in a region outside the GOA circuit; an insulating layer is disposed between the first conducting wire and the second conducting wire; and the first conducting wire, the insulating layer and the second conducting wire form a first capacitor.

At least one embodiment of the present disclosure further provides a display device, which comprises the above-mentioned display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The inventors of the present disclosure noted that conducting wires are easy to overlap with each other because of the dense wire arrangement around a GOA circuit. Therefore, during the process of manufacture and subsequent use of a display panel, when there is a larger voltage occurring around the GOA circuit, the phenomenon of ESD (Electrostatic Discharge) is easy to occur in the GOA circuit region, which may lead to a static damage to the display panel. Or, for example, external static electricity enters the GOA circuit through a gap between an opposed substrate and an array substrate, transmits through the gate metal layer disposed in the display panel, and discharges the static electricity on the source drain metal layer disposed in the display panel to burn out the source drain metal layer. The discharge of the static electricity damages various signal lines inside the GOA circuit and in the display panel, and brings a relatively weak antistatic ability to the display panel and a decreased yield of products.

It requires a high voltage occurring in the periphery of the display panel to generate static electricity damage. Because of the presence of the high voltage, electric charges with opposite electrical properties are induced on metal wirings inside the display panel. When the voltage difference between the two electric charges with opposite electrical properties reaches a certain degree, the static electricity damage occurs through an electric discharge. But the discharging process requires a media (for example, air) to transmit electric charges, causing damage.

In order to increase the antistatic ability of the display panel, available solutions are provided as follows.

Figure 1:
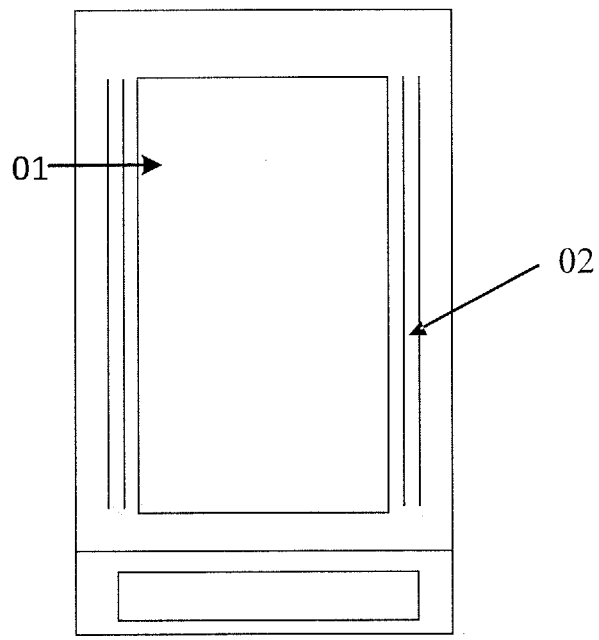
FIG. 1 is a schematic view of a display panel.
Figure 2:
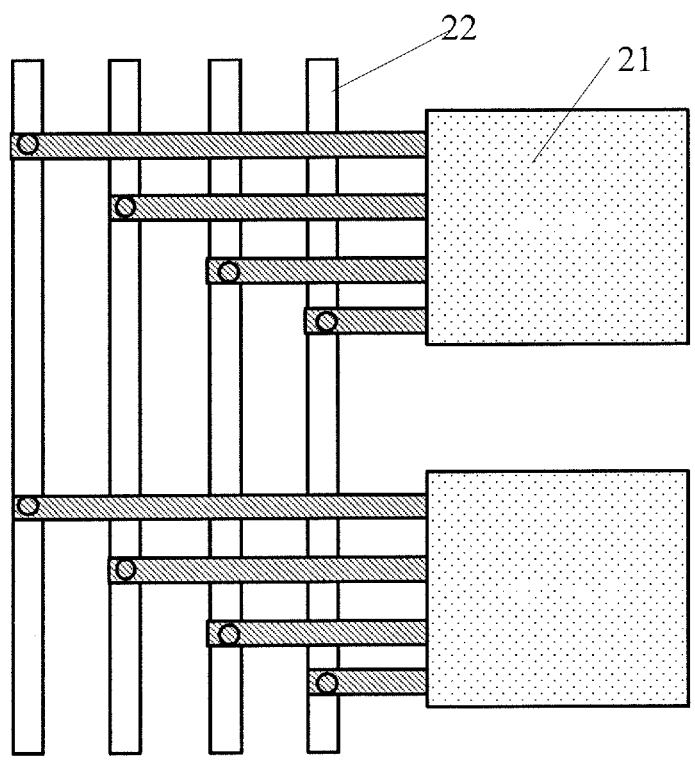
FIG. 2 is a schematic view of a GOA circuit region.
Figure 3:
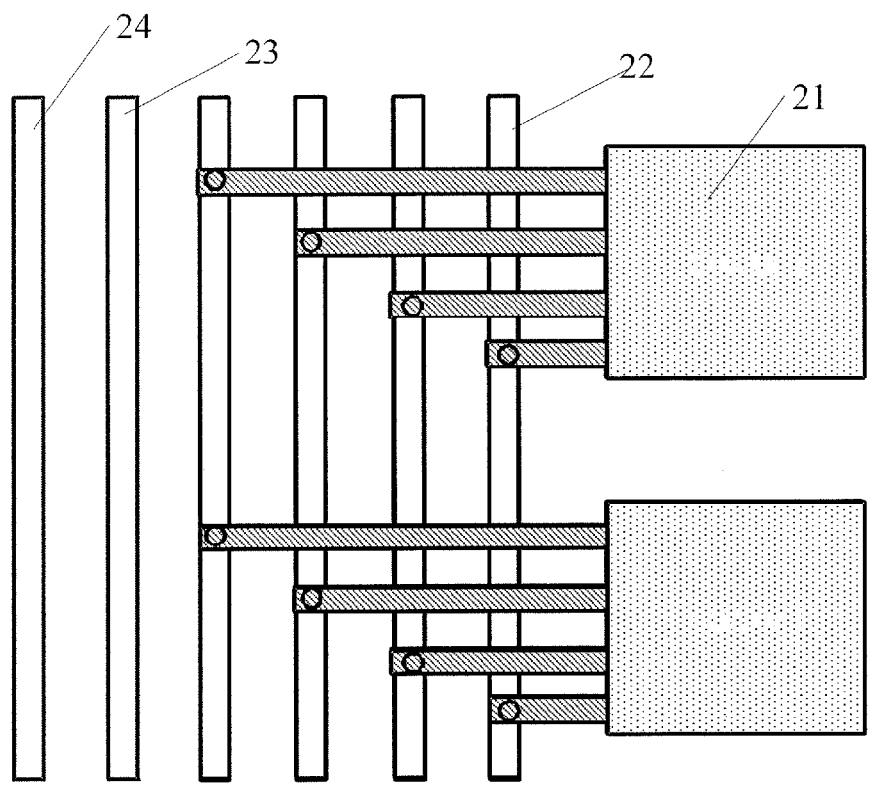
FIG. 3 is a schematic view of another GOA circuit region.

Solution one: a GND signal line (ground wire) 23 or a Vcom signal line (common electrode line) 24 can be added outside the GOA signal lines 22, so as to increase the antistatic ability of the display panel; the schematic view is illustrated in FIG. 3. But when a relatively large voltage is instantly generated outside, there's not enough time for the static electricity to be dissipated through the Vcom signal line 24 or the GND signal line 23, so the Vcom signal line 24 or the GND signal line 23 and the GOA signal lines 22 are damaged simultaneously.

Solution two: a sealant is moved outwards, and the GOA signal lines are completely covered by the sealant. In this way, the antistatic ability of the display panel can be increased, but the sealant is relatively close to the edge of the display panel, which may lead to a cutting defect during a cutting process and a decreased yield for the display panel. Therefore, the increase of the antistatic ability cannot depend on a sealant cover only.

It can be seen that the above-mentioned solutions cannot increase the antistatic ability of a display panel and the yield of products simultaneously.

Figure 4:
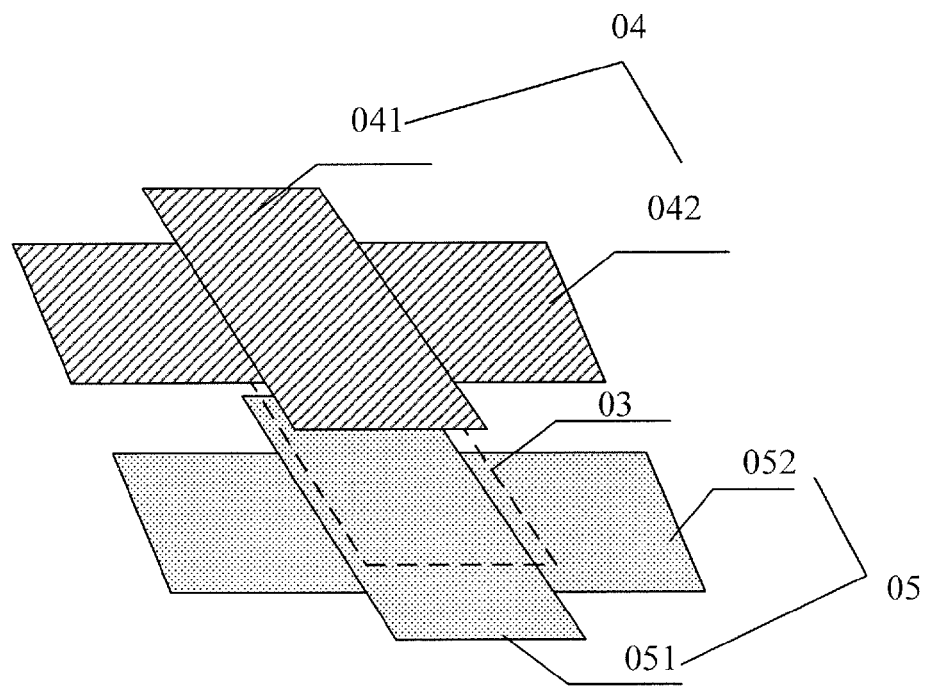
FIG. 4 is a schematic view illustrating that a first conducting wire, an insulating layer and a second conducting wire form a first capacitor in a first embodiment of the present disclosure.
Figure 5:
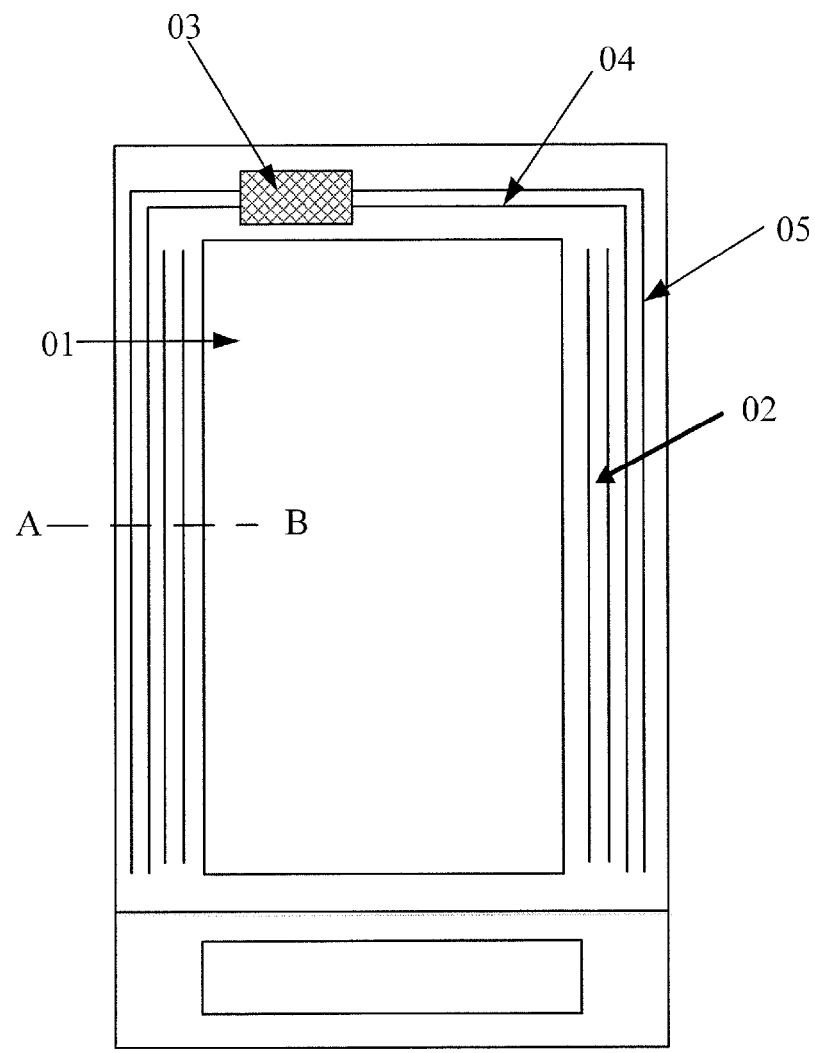
FIG. 5 is a schematic view of a display panel provided in the first embodiment of the present disclosure.

The first embodiment of the present disclosure provides a display panel. As illustrated in FIG. 4 and FIG. 5, a GOA circuit (the circuit at the position where GOA signal lines 02 are located in the drawings) is provided on at least one side of a display area 01 of the display panel; a first conducting wire 04 and a second conducting wire 05 are provided in the region outside the GOA circuit; an insulating layer (not shown in the drawings) is provided between the first conducting wire 04 and the second conducting wire 05, so that the first conducting wire 04 and the second conducting wire 05 are insulated from each other; and the first conducting wire 04, the insulating layer and the second conducting wire 05 form a first capacitor 03.

In an example, as illustrated in FIG. 4 and FIG. 5, the first capacitor 03 in the present embodiment is formed between the first conducting wire 04 and the second conducting wire 05, and the first conducting wire 04 and the second conducting wire 05 are distributed outside the GOA circuit (on the side away from the display area 01). But the first capacitor 03 is not limited to being located at the position where the first conducting wire 04 and the second conducting wire 05 are located. For example, the first conducting wire 04 can be divided into a first part 041 and a second part 042, and the second conducting wire 05 is also divided into a first part 051 and a second part 052. The first part 041 extends from the second part 042 transversely, for example, to form a wing shape; and the first part 051 also extends from the second part 052 transversely, for example, to form a wing shape. The widths of the first parts 041, 051 are greater than that of the second parts 042, 052, and the insulating layer is disposed between the first part 041 of the first conducting wire 04 and the first part 051 of the second conducting wire. Therefore, the first part 041 of the first conducting wire 04, the insulating layer and the first part 051 of the second conducting wire 05 form the first capacitor 03, as illustrated in FIG. 4. It should be noted that the position where the first capacitor 03 forms is not limited in the present embodiment. For example, the first capacitor 03 can be formed at any position between the first conducting wire 04 and the second conducting wire 05, and used to store static electricity. For example, the first capacitor 03 can be formed in a spare region on the display panel, namely a region that is in the periphery of the display panel and that has no effect on the structures of circuits (the specific region needs to be adjusted according to the application and the size of the display panel), and for example at a position of the first conducting wire 04 and the second conducting wire 05 having the width greater than the width of the rest thereof, so as to absorb external static electricity. In the present embodiment, the shapes of the first part 041 and the first part 051 are not limitative.

In an example, the display panel may comprise an array substrate and an opposed substrate, which, for example, can be a color filter substrate. The above-mentioned first capacitor 03 that is able to prevent static electricity discharge can be provided on the array substrate. For example, a gate electrode, a gate insulating layer and source/drain electrodes are provided on the array substrate; and the first conducting wire 04 is formed in a same layer as the source/drain electrodes, the second conducting wire 05 is formed in a same layer as the gate electrode, the insulating layer is formed in a same layer as the gate insulating layer, and the first conducting wire 04, the insulating layer and the second conducting wire 05 form the above-mentioned first capacitor 03. In an example, the gate insulating layer can be made of an inorganic insulating material such as silicon oxide, silicon nitride, silicon oxynitride or the like, and can also be made of an organic insulating material such as resin or the like.

In an example, both the first conducting wire 04 and the second conducting wire 05 of the present embodiment are provided in the region outside the GOA circuit. The first conducting wire 04 and the second conducting wire 05 are respectively formed in a same layer as the source/drain electrodes and the gate electrode, so they are in different layers. In various examples, the first conducting wire 04 and the second conducting wire 05 are not equidistant (at an equal distance) from the GOA circuit. For example, the distance from the first conducting wire 04 to the GOA circuit is smaller than that from the second conducting wire 05 to the GOA circuit; or, the first conducting wire 04 and the second conducting wire 05 are equidistant from the GOA circuit. Namely, the distance from the first conducting wire 04 to the GOA circuit and the distance from the second conducting wire 05 to the GOA circuit are not limitative, and they can be equal and can also be different, as long as two metal layers and the intermediate insulating layer form a capacitor.

The present embodiment is illustrated with respect to the example that the first conducting wire 04 and the second conducting wire 05 are not equidistant from the GOA circuit. As illustrated in FIG. 5, GOA circuits are provided on two sides of the display area 01 on the display panel, and the GOA circuits comprise GOA signal lines 02. A plurality of the GOA signal lines can be provided, two of which are illustrated in FIG. 5 as an example. The first conducting wire 04 and the second conducting wire 05 are further sequentially provided on the external side of the GOA signal lines 02. It can be seen from FIG. 5 that the distance from the first conducting wire 04 to the GOA circuits is smaller than that from the second conducting wire 05 to the GOA circuits, and the first conducting wire 04, the insulating layer (not shown in the drawings) and the second conducting wire 05 form the first capacitor 03 in a spare region. The specific position of the "spare region" mentioned in the present embodiment is provided according to the design requirement. For example, as for the display panel used in a mobile phone screen, the frames on the left and right sides of the display panel are usually relatively narrow, so the first capacitor can be disposed on the upper and lower sides. As for the display panel used in other electric device, many factors such as the application characteristics and circuit-design features are to be considered. Descriptions thereto are omitted.

In an example of the present disclosure, a common electrode line and a ground wire may be further provided on the display panel. For example, the first conducting wire 04, the second conducting wire 05 can be in a dangling state; or the first conducting wire 04 and the second conducting wire 05 can be connected to the ground wire or the common electrode line. In this way, when an instant large current occurs around the display panel, the first capacitor 03 formed by the first conducting wire 04, the insulating layer (not shown in the drawings) and the second conducting wire 05 can store the static electricity that originally would go into the GOA circuit, so as to prevent the conducting wires inside the GOA circuit from being damaged.

In the design method provided by the present embodiment, the first capacitor formed by the first conducting wire, the insulating layer and the second conducting wire is added in the periphery of the GOA circuit, so that the static electricity discharge occurs outside the GOA circuit, thus the static electricity discharge generated inside the GOA circuit can be avoided, preventing the static electricity damage from affecting the normal display of the display panel and increasing the antistatic ability of the display panel as well as the yield of products simultaneously.

A second embodiment of the present disclosure also provides a display panel. A GOA circuit is disposed on the display panel; a first conducting wire 14 and a second conducting wire 15 are provided in the region outside the GOA circuit; an insulating layer 11 is disposed between the first conducting wire 14 and the second conducting wire 15;

and the first conducting wire 14, the insulating layer 11 and the second conducting wire 15 form a first capacitor.

The second embodiment differs from the first embodiment in that the second embodiment comprises not only a first capacitor but also a second capacitor.

In an example, at least a spacer 5 is further provided in the region outside the GOA circuit and on a color filter substrate; a conductive layer 4 is disposed on the surface and the periphery of the spacer 5; and the conductive layer 4 is disposed opposite to the region where the first capacitor is located on an array substrate. A passivation layer 13 is further disposed on the source/drain electrodes 12 of the array substrate. The conductive layer 4, the passivation layer 13 and the first conducting wire 14 at the corresponding position on the array substrate form the second capacitor. The conductive layer 4, for example, is a metal conductive layer, and can also be an oxide conductive layer or the like.

For example, a common electrode line and a ground wire (not shown in the drawings) can be further provided on the display panel. The first conducting wire 14 and the second conducting wire 15 can be in a dangling state; or the first conducting wire 14 and the second conducting wire 15 can be connected to the ground wire or the common electrode line.

For example, the first conducting wire 14, the second conducting wire 15 and the conductive layer 4 can be in a dangling state; or the first conducting wire 14, the second conducting wire 15 and the conductive layer 4 can be connected to the ground wire or the common electrode line.

Figure 6:
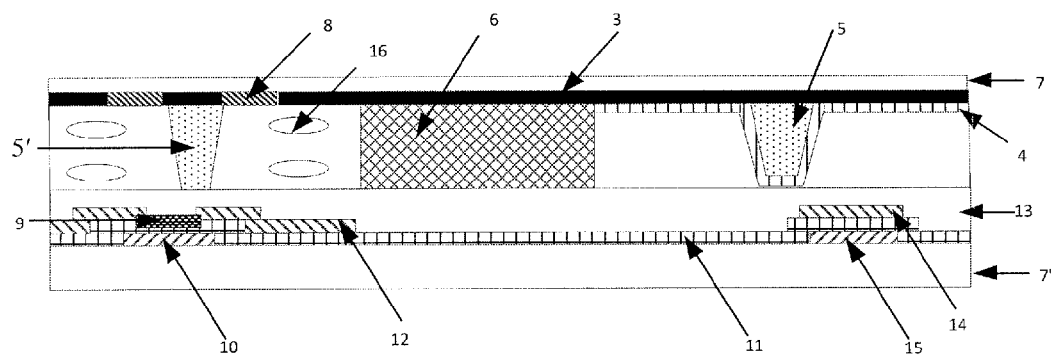
FIG. 6 is a cross-sectional view of a display panel in a second embodiment of the present disclosure.

The cross-sectional view of the above-mentioned display panel taken along the A-B cutting line is illustrated in FIG. 6. The display panel comprises a color filter substrate and an array substrate, which are disposed oppositely to form a liquid crystal cell.

The color filter substrate comprise color filters 8 and a black matrix 3 fabricated on a base substrate 7 (typically a glass substrate).

The manufacture of the array substrate comprises the following steps. A gate electrode layer is fabricated on a base substrate 7, and after an etching process, a gate electrode 10 is formed in a display area, and a second conducting wire 15 is formed in the region outside the GOA circuit. A gate insulating layer 11 and a semiconductor layer 9 are sequentially fabricated on the gate electrode 10 and the second conducting wire 15, followed by retaining the semiconductor layer 9 only at a position to which the gate electrode 10 corresponds after an etching process. Subsequently, a source drain metal layer 12 is fabricated on the semiconductor layer 9, after an etching process, a source electrode and a drain electrode that are disconnected to each other are formed on the gate electrode in the display area, and a first conducting wire 14 is formed at a position corresponding the second conducting wire 15 in the region outside the GOA circuit. The manufacturing steps of the array substrate can further comprise the formation of a passivation layer 13 covering the source drain metal layer 12 and the first conducting wire 14. It can be seen that the first conducting wire 14 and the source drain metal layer 12 are formed in a same layer, the second conducting wire 15 and the gate electrode 10 are formed in a same layer, and the insulating layer between the first conducting wire 14 and the second conducting wire 15 is formed in a same layer as the gate insulating layer 11.

In FIG. 6, a sealant 6 is further provided between the array substrate and the color filter substrate, and the internal side of the sealant 6 is the display area used to display images. Spacers 5' are disposed at the internal side of the sealant 6, and liquid crystal 16 is provided around the spacers 5'. The external side of the sealant 6 is the above-mentioned region outside the GOA circuit, which cannot be used to display. In an example, at least a spacer 5 used as a wall structure can be further provided in the region outside the GOA circuit on the display panel, and the spacer 5 and the spacers 5' in the display area can be fabricated simultaneously.

The spacer 5 provided in the region outside the GOA circuit is used as a wall structure, which can have the function of isolating air to some degree on one hand, so that static electricity cannot be transmitted through air to damage metal layers. On the other hand, because the conductive layer 4 is disposed on the surface and the periphery of the spacer 5, induced electric charges generated in the region outside the GOA circuit can be dissipated or released through a discharge. In this way, even if the static electricity damage occurs, the display of the display panel is not affected. Therefore, the antistatic ability of the panel can be improved notably.

The first conducting wire 14 and the second conducting wire 15 that are respectively formed in a same layer as the source drain metal layer 12 and the gate electrode 10 in the region outside the GOA circuit on the display panel form the first capacitor to store electric charges. When there is static electricity around, the static electricity can be stored in the first capacitor and be dissipated, thus preventing the internal structure from being directly damaged by the static electricity. The first capacitor is formed by the first conducting wire 14, the insulating layer (namely the gate insulating layer 11) and the second conducting wire 15, which can store and dissipate the induced electric charges generated by an external high voltage, so static electricity damage does not easily occur.

Figure 7:
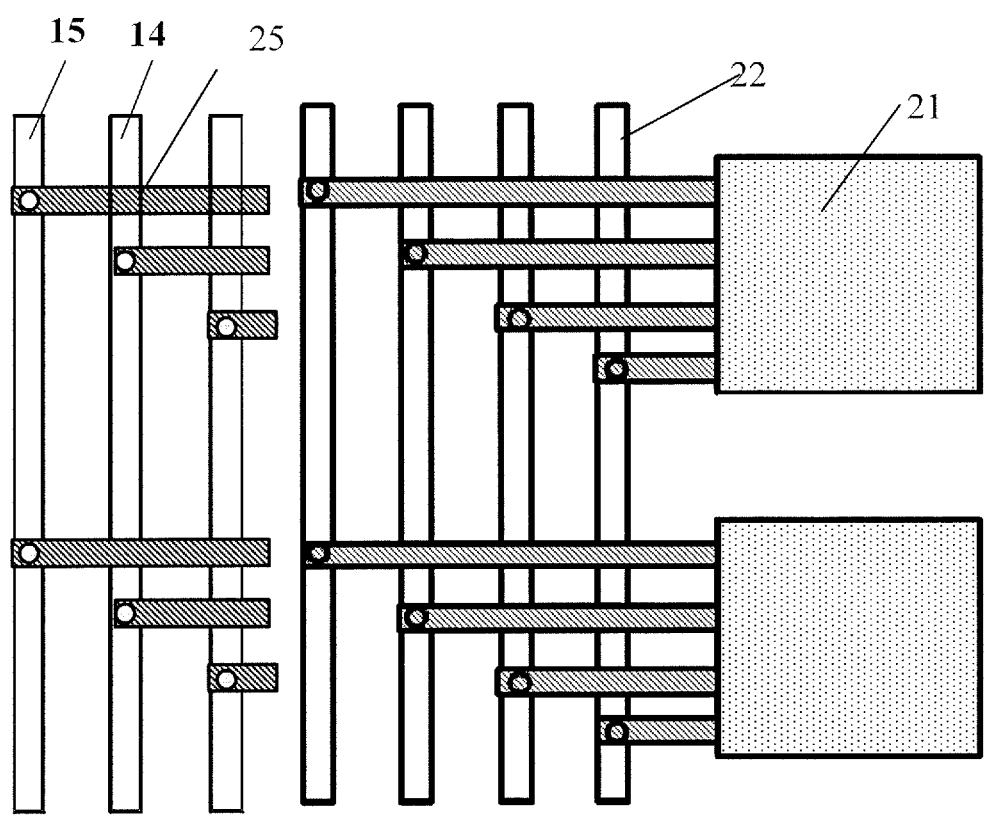
FIG. 7 is a schematic view of the arrangement of a GOA circuit region after a capacitor is added in an embodiment of the present disclosure.

A schematic view of an example of the GOA region in the present embodiment is illustrated in FIG. 7. A first capacitor 25 is formed through the overlapping of the first conducting wire, the insulating layer and the second conducting wire outside the GOA signal lines 22.

In the embodiment, the spacer 5 is disposed at a position corresponding to the first capacitor on the color filter substrate in the region outside the GOA circuit, and the conductive layer 4 is disposed on the surface and the periphery of the spacer 5. For example, the spacer 5 and the spacers 5' on the display panel can be made of a same material and be made simultaneously, and for example can be made of ITO or the like. In an example, the sum of the height of the conductive layer 4 and that of the spacer 5 is slightly smaller than the cell gap of a liquid crystal cell, so as to avoid a gap defect in the periphery. The advantages of this structure lies in that when there is static electricity in the region outside the GOA circuit, because of the blocking function of the spacer 5, on one hand, the static electricity cannot damage the peripheral wires of GOA through air, and on the other hand the conductive layer 4 can also dissipate the peripheral static electricity.

Besides the technical effect the first capacitor in the first embodiment can achieve, the second embodiment further forms the second capacitor through the conductive layer disposed on the surface and the periphery of the spacer, the passivation layer and the first conducting wire, so that the antistatic ability is further increased on the basis of the first embodiment.

It should be noted that the first capacitor in the first embodiment is disposed in the region outside the GOA circuit on the array substrate of the display panel. The second embodiment comprises both the first capacitor and the second capacitor. The first capacitor is disposed outside the GOA region on the array substrate of the display panel, and the first conducting wire 14 formed in a same layer as the source/drain electrodes, the gate insulating layer 11, and the second conducting wire 15 formed in a same layer as the gate electrode form the first capacitor; the second capacitor is disposed in a region corresponding to the GOA on the color filter substrate of the display panel, and the conductive layer 4 on the surface of the spacer 5, the passivation layer 13 on the array substrate and the first conducting wire 14 formed in a same layer as the source/drain electrodes on the array substrate form the second capacitor.

On the basis of the above embodiments, at least one embodiment of the present disclosure further provides a display device, which comprises the display panel provided by the first embodiment or the second embodiment. The display device may be any device or component having display function such as a mobile phone, a tablet computer, a television set, a display monitor, a notebook computer, a digital photo frame, a navigator or the like.

A GOA circuit is disposed on the display panel provided by embodiments of the present disclosure; a first conducting wire and a second conducting wire are disposed in the region outside the GOA circuit; an insulating layer is further disposed between the first conducting wire and the second conducting wire; and the first conducting wire, the insulating layer and the second conducting wire form a first capacitor. In the embodiments of the present disclosure, an antistatic capacitor is disposed on the periphery of the GOA circuit of the display panel to relieve the external static electricity according to the principle of occurrence of the static electricity discharge, so that the static electricity is blocked by the capacitor and cannot enter the GOA circuit when the static electricity discharge generates a larger voltage, and thus the internal signal lines of the GOA circuit and the display panel can be protected, so that the antistatic ability of the display panel and the yield of products are increased.

The above embodiments are only used to describe the present disclosure and not limitative to the present disclosure; those skilled in the relevant art can make various variations and modifications without departing from the spirit and scope of the present disclosure; therefore, all equivalent technical solutions belong to the scope of the present disclosure; the scope of the present disclosure are defined by the claims.

This application claims the benefit of Chinese Patent Application No. 201420247851.1, filed on May 14, 2014, which is hereby entirely incorporated by reference.

The invention claimed is:

1. A display panel, comprising a GOA circuit, an array substrate and an opposed substrate, wherein a first conducting wire and a second conducting wire are disposed in a region outside the GOA circuit, an insulating layer is disposed between the first conducting wire and the second conducting wire, and the first conducting wire, the insulating layer and the second conducting wire form a first capacitor;
the first capacitor is provided on the array substrate,
a spacer is further disposed outside the GOA circuit on the opposed substrate, a conductive layer is disposed on a surface and periphery of the spacer, and the conductive layer is disposed opposite to a region where the first capacitor is located on the array substrate; and
a passivation layer is further disposed on the array substrate, and the conductive layer, the passivation layer and the first conducting wire at a corresponding position on the array substrate form a second capacitor.

2. The display panel as claimed in claim 1, wherein each of the first conducting wire and the second conducting wire comprises a first part and a second part, a width of the first part is greater than that of the second part, and the insulating layer is disposed between the first part of the first conducting wire and the first part of the second conducting wire.

3. The display panel as claimed in claim 1, wherein a gate electrode, a gate insulating layer and source/drain electrodes are disposed on the array substrate; and the first conducting wire and the source/drain electrodes are formed in a same layer, the second conducting wire and the gate electrode are formed in a same layer, and the insulating layer and the gate insulating layer are formed in a same layer.

4. The display panel as claimed in claim 3, wherein the first conducting wire and the second conducting wire are not equidistant from the GOA circuit.

5. The display panel as claimed in claim 4, wherein a distance from the first conducting wire to the GOA circuit is smaller than that from the second conducting wire to the GOA circuit.

6. The display panel as claimed in claim 3, wherein the first conducting wire and the second conducting wire are equidistant from the GOA circuit.

7. The display panel as claimed in claim 3, wherein a common electrode line and a ground wire are further disposed on the array substrate; and
the first conducting wire and the second conducting wire are in a dangling state, or the first conducting wire and the second conducting wire are connected to the ground wire or the common electrode line.

8. The display panel as claimed in claim 4, further comprising a common electrode line and a ground wire, wherein the first conducting wire and the second conducting wire are in a dangling state, or the first conducting wire and the second conducting wire are connected to the ground wire or the common electrode line.

9. The display panel as claimed in claim 6, further comprising a common electrode line and a ground wire, wherein the first conducting wire and the second conducting wire are in a dangling state, or the first conducting wire and the second conducting wire are connected to the ground wire or the common electrode line.

10. The display panel as claimed in claim 1, further comprising a common electrode line and a ground wire, wherein the first conducting wire, the second conducting wire and the conductive layer are in a dangling state, or the first conducting wire, the second conducting wire and the conductive layer are connected to the ground wire or the common electrode line.

11. A display device, comprising the display panel as claimed in claim 1.

12. The display panel as claimed in claim 1, wherein the display panel comprises a display area, the GOA circuit is provided outside of the display area, and the first capacitor is provided on side of the GOA circuit opposite to the display area.

* * * * *